United States Patent
Lee et al.

(10) Patent No.: US 7,575,981 B2
(45) Date of Patent: Aug. 18, 2009

(54) METHOD FOR FABRICATING ISOLATION LAYER IN SEMICONDUCTOR DEVICE

(75) Inventors: Hae-Jung Lee, Kyoungki-do (KR); Hyun-Sik Park, Kyoungki-do (KR); Jae-Kyun Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 58 days.

(21) Appl. No.: 12/004,240

(22) Filed: Dec. 18, 2007

(65) Prior Publication Data

US 2008/0160718 A1    Jul. 3, 2008

(30) Foreign Application Priority Data

Dec. 27, 2006  (KR) .................. 10-2006-0134305

(51) Int. Cl.
*H01L 21/76* (2006.01)
(52) U.S. Cl. .................. 438/424; 438/425; 438/427; 438/435; 438/444; 438/622; 438/623; 438/633; 257/E21.546
(58) Field of Classification Search ............ 438/425, 438/626
See application file for complete search history.

(56) References Cited

U.S. PATENT DOCUMENTS 6,596,607 B2 * 7/2003 Ahn ........................... 438/424

FOREIGN PATENT DOCUMENTS

| KR | 2002-0071169 | 9/2002 |
| KR | 2004-0110794 | 12/2004 |
| KR | 2006-0005504 | 1/2006 |

* cited by examiner

*Primary Examiner*—N Drew Richards
*Assistant Examiner*—Kyoung Lee
(74) *Attorney, Agent, or Firm*—Blakely, Sokoloff, Taylor & Zafman LLP

(57) ABSTRACT

A method for fabricating an isolation layer in a semiconductor device includes providing a substrate, forming a trench over the substrate, forming a liner nitride layer and a liner oxide layer along a surface of the trench, forming an insulation layer having an etch selectivity ratio different from that of the liner oxide layer over the liner oxide layer, forming a spin on dielectric (SOD) oxide layer to fill a portion of the trench over the insulation layer, and forming a high density plasma (HDP) oxide layer for filling the remaining a portion of the trench.

10 Claims, 5 Drawing Sheets

METHOD FOR FABRICATING ISOLATION LAYER IN SEMICONDUCTOR DEVICE

CROSS-REFERENCE TO RELATED APPLICATIONS

The present invention claims priority of Korean patent application number 2006-0134305, filed on Dec. 27, 2006, which is incorporated by reference in its entirety.

BACKGROUND OF THE INVENTION

The present invention relates to a method for fabricating a semiconductor device, and more particularly, to a method for fabricating an isolation layer in a semiconductor device.

As known, an active region is defined by forming an isolation layer over a substrate using a shallow trench isolation (STI) method.

FIGS. 1A to 1C are cross-sectional views of a method for fabricating a typical isolation layer in a semiconductor device.

Referring to FIG. 1A, a pad oxide layer 102 and a pad nitride layer 103 are formed over a substrate 101 and then patterned to form an isolation layer region. Subsequently, the substrate 101 is etched using the pad oxide layer 102 and the pad nitride layer 103 as an etch barrier to form a trench 104.

A thermal oxide layer 105 is formed in the trench 104. A liner nitride layer 106 and a liner oxide layer 107 are laminated over the resultant surface of the substrate 101 including the trench 104.

Referring to FIG. 1B, a spin on dielectric (SOD) oxide layer 108 is formed to fill a portion of the trench 104 is formed.

Referring to FIG. 1C, a high density plasma (HDP) oxide layer 109 is formed to fill the remaining portion of the trench 104.

The typical method laminates the liner nitride layer 106 and the liner oxide layer 107 over the trench 104 and fills the trench 104 with the SOD oxide layer 108 and the HDP oxide layer 109, thereby forming the isolation layer.

However, a wet etch of the SOD oxide layer is needed to allow the SOD oxide layer 108 to remain in a portion of the trench 104. During the wet etch, the liner oxide layer 107 is damaged and thus the liner nitride layer 106 is exposed on an upper portion of the trench 104. As a result, during a process for forming the HDP oxide layer 109, the liner nitride layer 106 may be damaged by a sputtering, so that a gate oxide integrity (GOI) failure of the semiconductor device may be caused. Consequently, yield and reliability of the semiconductor device is deteriorated.

SUMMARY OF THE INVENTION

Embodiments of the present invention are directed to provide a method for fabricating an isolation layer in a semiconductor device for improving a GOI for reducing GOI failure and increasing yield and reliability of the semiconductor device by preventing a loss of a liner oxide layer when performing a wet etch on a SOD oxide layer.

In accordance with an aspect of the present invention, there is provided a method for fabricating an isolation layer in a semiconductor device. The method includes providing a substrate, forming a trench over the substrate, forming a liner nitride layer and a liner oxide layer along a surface of the trench, forming an insulation layer having an etch selectivity ratio different from that of the liner oxide layer over the liner oxide layer, forming a SOD oxide layer to fill a portion of the trench over the insulation layer, and forming a HDP oxide layer for filling the remaining portion of the trench.

DESCRIPTION OF SPECIFIC EMBODIMENTS

FIGS. 2A to 2F are cross-sectional views of a method for fabricating an isolation layer in a semiconductor device in accordance with a specific embodiment of this invention.

Figure 1A:
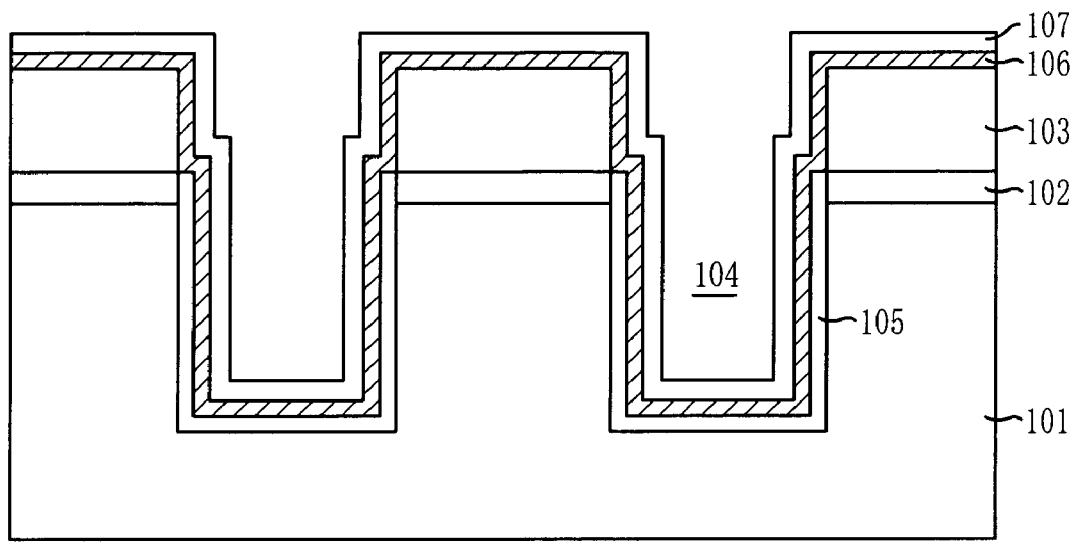
FIGS. 1A to 1C are process cross-sectional views of a method for fabricating a typical isolation layer in a semiconductor device.
Figure 1B:
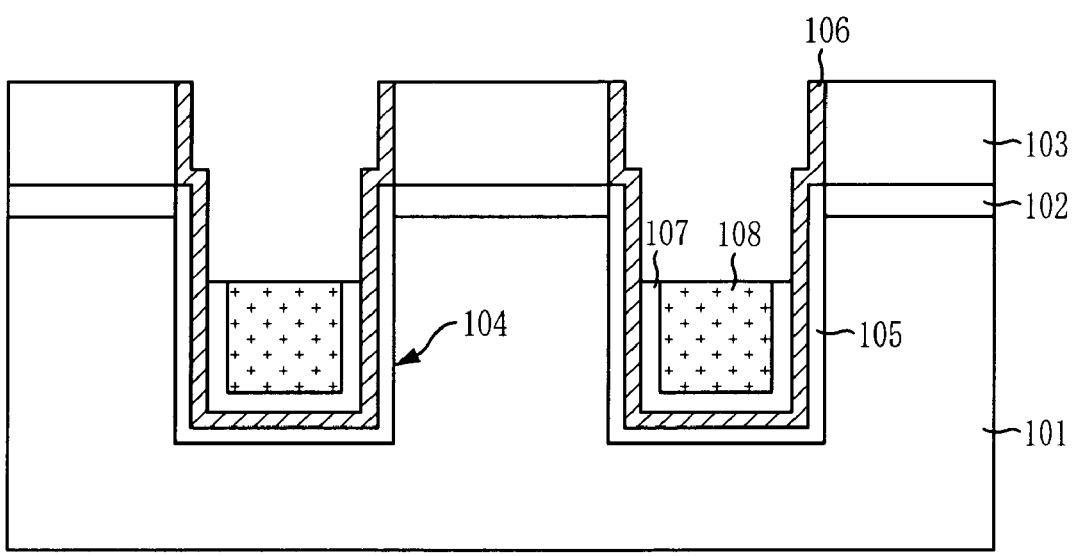
Figure 1C:
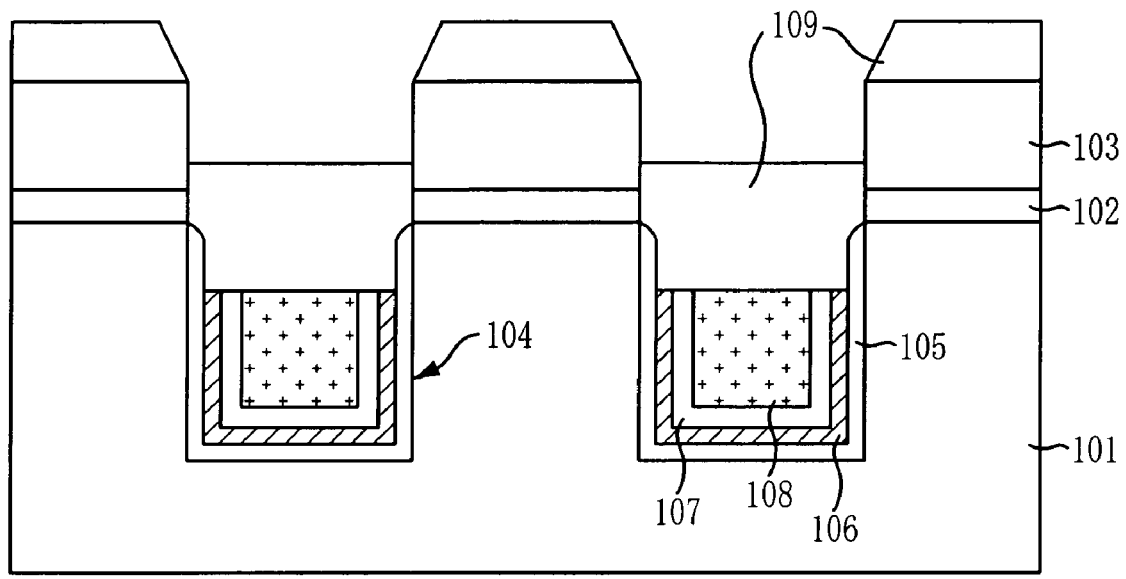
Figure 2A:
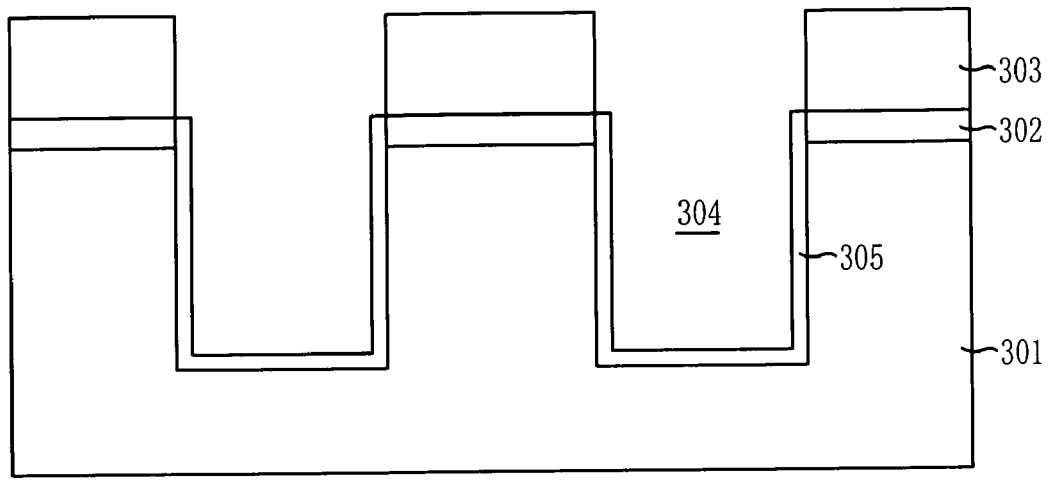
FIGS. 2A to 2F are cross-sectional views of a method for fabricating an isolation layer in a semiconductor device in accordance with an embodiment of the present invention.

Referring to FIG. 2A, a pad oxide layer 302 and a pad nitride layer 303 are formed over a substrate 301 to open a region for forming the isolation layer. Here, the substrate 301 may be a semiconductor substrate for a dynamic random access memory (DRAM) process. Also, a photoresist is coated over the pad oxide layer 302 and the pad nitride layer 303. A photoresist pattern is formed by patterning the photoresist to open the region for forming the isolation layer using photo-exposure and development processes. The pad oxide layer 302 and the pad nitride layer 303 are etched by using the photoresist pattern as a mask and the photoresist pattern is removed.

Sequentially, the opened substrate 301 is selectively etched to form a trench 304.

An oxide layer 305 is formed along a surface of the trench 304. The oxide layer 305 may include a thermal oxide layer formed by an oxidation process.

Figure 2B:
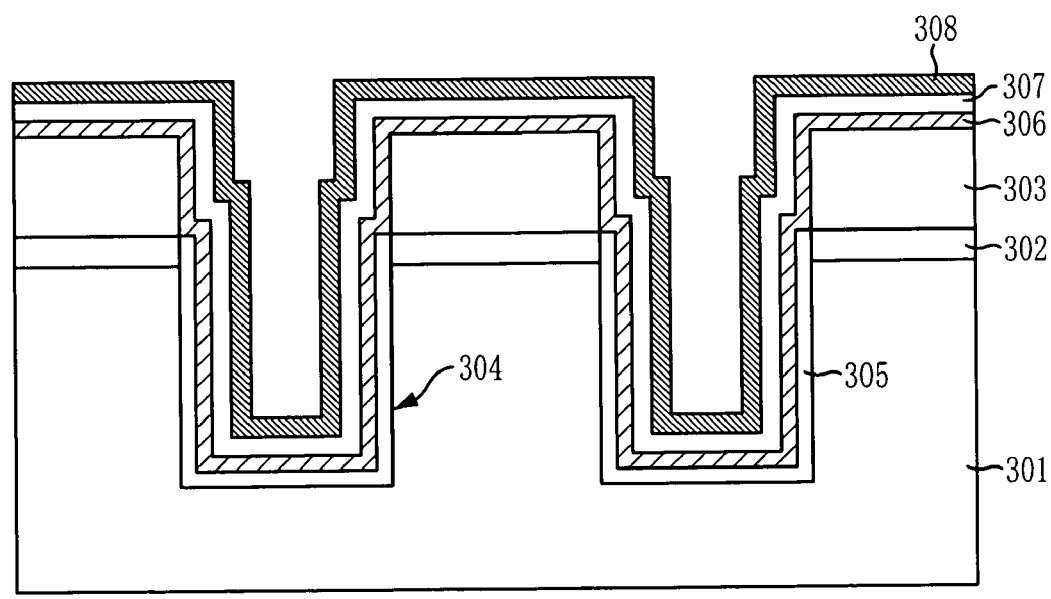

Referring to FIG. 2B, a liner nitride layer 306 and a liner oxide layer 307 are sequentially formed over the resultant surface of the substrate 301 which includes the trench 304. The liner nitride layer 306 is used as a buffer layer for buffering a stress caused by a difference of thermal expansion coefficients between a subsequent high density plasma (HDP) oxide layer filling the trench 304 and the silicon substrate 301.

The liner oxide layer 307 is used as a buffer layer for buffering a loss of the liner nitride layer 306 caused by sputtering when the subsequent HDP oxide layer is formed. The liner oxide layer 307 includes a low pressure tetra ethyle ortho silicate (LP-TEOS) layer or a plasma oxide layer. The LP-TEOS layer has a thickness ranging from approximately 20 Å to approximately 200 Å. The plasma oxide layer has a thickness ranging from approximately 20 Å to approximately 50 Å.

An insulation layer 308 is formed over the liner oxide layer 307. The insulation layer 308 prevents a loss of the liner oxide layer 307 during the wet etch of the subsequent SOD layer. The insulation layer 308 includes a material having an etch selectivity ratio to the oxide layer. The insulation layer 308 may include a nitride layer having a thickness ranging from approximately 20 Å to approximately 50 Å. The insulation layer 308 may include a silicon oxy-nitride (SiON) layer having a thickness ranging from approximately 20 Å to approximately 100 Å. The insulation layer 308 may include a hafnium oxide ($HfO_2$) layer or an aluminum oxide ($Al_2O_3$) layer having a thickness ranging from approximately 20 Å to approximately 50 Å. It is preferable to include the nitride layer.

The liner oxide layer 307 and the insulation layer 308 are formed to have a sum of their thicknesses substantially the same as that of a liner oxide layer used in the typical method so that a gap-fill failure of the subsequent HDP oxide layer does not occur. For illustration, in case the typical liner oxide layer has a thickness of approximately 80 Å, the liner oxide layer 307 is formed to have a thickness of approximately 50 Å while the insulation layer 308 is formed to a thickness of 30 Å in this invention.

Figure 2C:
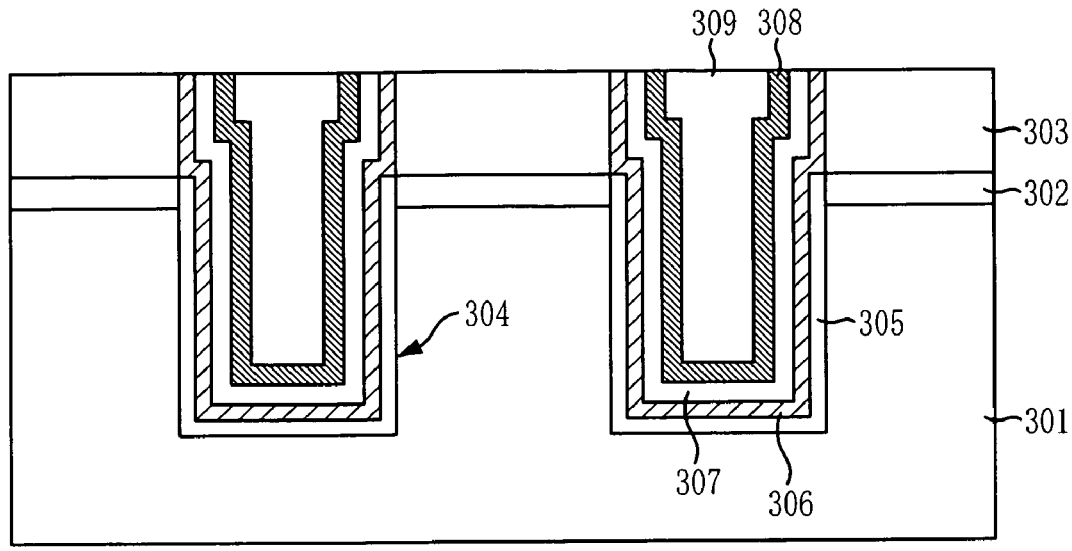

Referring to FIG. 2C, a SOD oxide layer 309 is formed over the insulation layer 308 until the trench 304 is completely filled. Then, anneal and planarization processes are performed. In the planarization process, the pad oxide layer 303 is used as a planarization target. The planarization is performed using a chemical mechanical polishing (CMP) method. The SOD oxide layer 309 improves a gap-fill of the trench 304.

Figure 2D:
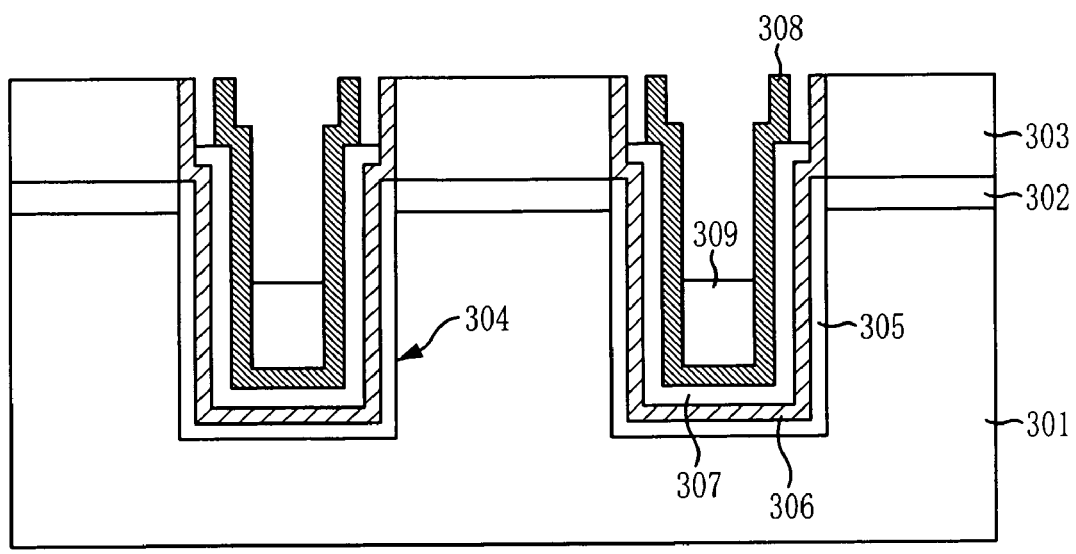

Referring to FIG. 2D, the SOD oxide layer 309 is etched to partially fill the trench 304 by using a wet etch. The etch process may be performed using a buffered oxide etchant (BOE). At this time, the SOD oxide layer 309 is etched to a certain depth below a top surface of the substrate 301 in consideration of the loss in a subsequent process.

The BOE used for the wet etch etched the oxide layer and the nitride layer in a ratio of 100:1. Therefore, the insulation layer 308 remains without being damaged when the SOD oxide layer 309 is etched. Furthermore, an upper portion of the liner oxide layer 307 below the insulation layer 308 remains or may be partially damaged.

Figure 2E:
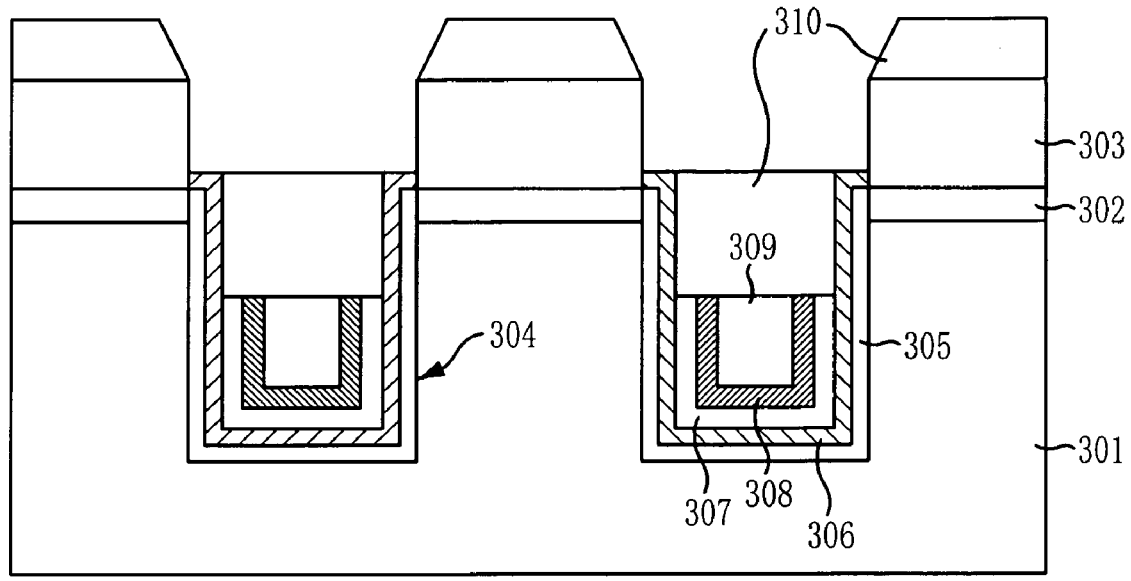

Referring to FIG. 2E, an HDP oxide layer 310 is formed over the SOD oxide layer 309. The HDP oxide layer 310 fills the trench 304 to form the isolation layer.

The HDP oxide layer 310 is formed by sequentially performing a deposition and a sputtering etch. At this time, the insulation layer 308 and the liner oxide layer 307 at the upper portion of the trench 304 are removed by the sputtering etch, but a loss of the liner nitride layer 306 can be prevented because the insulation layer 308 and the liner oxide layer 307 act as buffer layers for preventing the loss of the liner nitride layer 306 due to the sputtering etch.

Figure 2F:
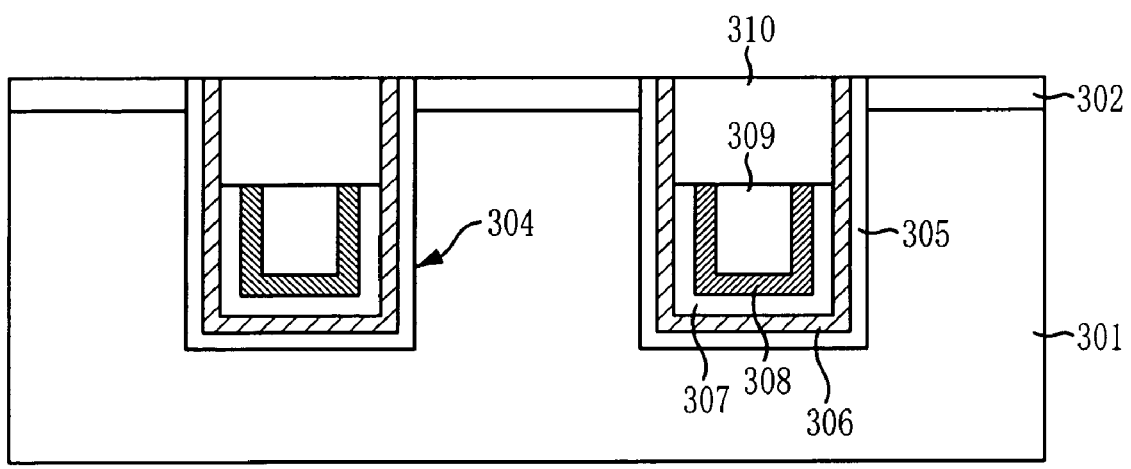

Referring to FIG. 2F, the resultant structure of FIG. 2E is planarized until the pad nitride layer 303 is removed. The planarization process is performed by using a CMP method.

In this invention, after the liner nitride layer 306 and the liner oxide layer 307 are formed, the insulation layer 308 having an etch selectivity rate to the oxide layer is additionally deposited. Therefore, when forming the SOD oxide layer 309, it is possible to prevent the loss of the liner oxide layer 307. In addition, when forming the HDP oxide layer 310, it is possible to preclude the loss of the liner nitride layer 306. As a result, the GOI failure of the semiconductor device is prevented, and the yield and reliability characteristic is improved.

This invention prevents the loss of the liner oxide layer during wet etching the SOD layer using the BOE solution and thus the loss of the liner nitride layer is prevented during sequentially depositing the HDP oxide layer. As a result, the GOI failure caused by the loss of the liner nitride layer can be prevented, and the yield and reliability characteristic is improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating an isolation layer in a semiconductor device, the method comprising:
   providing a substrate;
   forming a trench over the substrate;
   forming a liner nitride layer and a liner oxide layer along a surface of the trench;
   forming an insulation layer having an etch selectivity ratio different from that of the liner oxide layer over the liner oxide layer;
   forming a spin on dielectric (SOD) oxide layer to fill a portion of the trench over the insulation layer; and
   forming a high density plasma (HDP) oxide layer for filling the remaining portion of the trench.

2. The method of claim 1, wherein the insulation layer includes a nitride layer and has a thickness ranging from approximately 20 Å to approximately 50 Å.

3. The method of claim 1, wherein the insulation layer includes a silicon oxy-nitride (SiON) layer and has a thickness ranging from approximately 20 Å to approximately 100 Å.

4. The method of claim 1, wherein the insulation layer includes a hafnium oxide ($HfO_2$) layer or an aluminum oxide ($Al_2O_3$) layer and has a thickness ranging from approximately 20 Å to approximately 50 Å.

5. The method of claim 1, wherein forming the SOD oxide layer includes:
   forming the SOD oxide layer over the insulation layer until the trench is filled;
   planarizing the SOD oxide layer to a top surface of the substrate; and
   partially etching the SOD oxide layer to remain in the portion of the trench.

6. The method of claim 5, wherein the planarization process is performed using a chemical mechanical polishing (CMP) method.

7. The method of claim 5, wherein said partially etching the SOD oxide layer is performed through a wet etch using a buffered oxide etchant (BOE).

8. The method of claim 1, wherein the liner oxide layer includes a low pressure tetra ortho silicate (LP-TEOS) layer and has a thickness ranging from approximately 20 Å to approximately 200 Å.

9. The method of claim 1, wherein the liner oxide layer includes a plasma oxide layer and has a thickness ranging from approximately 20 Å to approximately 50 Å.

10. The method of claim 1, further comprising, before forming the liner nitride layer, forming a thermal oxide layer along the surface of the trench.

* * * * *